United States Patent
Huang et al.

(10) Patent No.: US 7,109,899 B2
(45) Date of Patent: Sep. 19, 2006

(54) APPARATUS AND METHOD FOR INPUTTING KEY SIGNALS TO OPTICAL DISK PLAYER USING ANALOG SIGNAL

(75) Inventors: Anderson Huang, Hsin-Tien (TW); Mike Lee, Hsin-Tien (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/066,769

(22) Filed: Feb. 25, 2005
(Under 37 CFR 1.47)

(65) Prior Publication Data
US 2005/0206547 A1    Sep. 22, 2005

(30) Foreign Application Priority Data
Feb. 26, 2004    (TW) ............................... 93104994 A

(51) Int. Cl.
*H03M 9/00*    (2006.01)
*G11R 20/10*    (2006.01)

(52) U.S. Cl. ..................... 341/101; 341/155; 369/47.1; 369/59.1

(58) Field of Classification Search ............... 341/155, 341/144, 101; 369/47.1, 59.1
See application file for complete search history.

(56) References Cited

U.S. PATENT DOCUMENTS

| | | | | |
|---|---|---|---|---|
| 5,659,312 A | * | 8/1997 | Sunter et al. | ............... 341/155 |
| 6,933,868 B1 | * | 8/2005 | Premy et al. | ............... 341/144 |
| 6,933,869 B1 | * | 8/2005 | Starr et al. | .................. 341/144 |

* cited by examiner

*Primary Examiner*—Lam T. Mai
(74) *Attorney, Agent, or Firm*—Michael A. Glenn; Glenn Patent Group

(57) ABSTRACT

A key signals input apparatus and related operating method used for reducing chip I/O number is described. The key signals input apparatus has a plurality of keys and a signal conversion module. The signal conversion module converts key signals into an analog voltage before directing to the chip for further processing. An analog signal decoding module designed in the chip decodes the analog signal so as to recover a plurality of input key values such that the chip may perform further operations according to the indication of the key signals.

13 Claims, 3 Drawing Sheets

APPARATUS AND METHOD FOR INPUTTING KEY SIGNALS TO OPTICAL DISK PLAYER USING ANALOG SIGNAL

RELATED APPLICATIONS

The present application is based on, and claims priority from, Taiwan Application Serial Number 93104994, filed Feb. 26, 2004, the disclosure of which is hereby incorporated by reference herein in its entirety.

BACKGROUND

1. Field of Invention

The present invention relates to an apparatus and a method for inputting input key signals for an optical disk player. More particularly, the present invention relates to an apparatus and a method for inputting input key signals for an optical disk player using an analog voltage input signal.

2. Description of Related Art

The fabrication of a chip has become much more complex because of the development of semiconductor technology. The density of logic gates in a chip is rapidly increasing due to the improvements of semiconductor processes. A single chip now can accomplish functions previously requiring a plurality of chips. This is what is called system-on-chip (SOC).

However, the area of a chip may be very large if this chip has to provide many functions. More area means more cost. Additionally, I/O (input/output) among modules in the chip becomes very complex. If more inputs and outputs of the chip are intended, the fabrication and packaging cost may increase and difficulty in testing the chip is foreseeable. How to reduce the total of a chip I/O now becomes an important issue since those chip designers endeavor to reduce both the cost and area of a chip.

Reducing the number of chip I/O not only reduces the cost, but also reduces the design complexity of the circuit board of the chip. Chip designers have more flexibility when designing if the number of circuit paths on their chip circuit board is more less than before. The electromagnetic interference between different circuit paths can also be lowered.

An important issue is that many systems use keys as an interface for communicating with a user. The circuit paths used to connect the keys and send signals from the keys will occupy a large space even those functions of the keys are simple. Thus, an approach for reducing and simplifying the chip I/O is needed.

FIG. 1 is a circuit diagram illustrating a traditional solution for inputting key signals into a chip. With reference to FIG. 1, keys 102, 104, 106, and 108 are used to send control signals to a chip 112. The chip 112 has four input pins 120, 122, 124 and 126 for receiving signals. The key 102 has a conducting status and a breaking one. When a switch 130 of the key 102 is pressed, a reference voltage 110 connects to the input pin 120 electrically such that the voltage value on the input pin 120 is equal to the reference voltage 110. When the switch 130 is released, the input pin 120 is grounded through a resistor 114, and the voltage value of the input pin 120 is down to zero. According to the same operation way, the release/connection statuses of the keys 104, 106, and 108 incorporate with resistors 116, 117, and 118 determine the voltages on input pins 122, 124, and 126.

The circuit diagram shown in FIG. 1, includes four input statuses accomplished by 4 keys. Logic 0 and 1 are indicated if a key is released and pressed, respectively. The chip 112 then determines the key statuses by detecting logic 0 or 1 delivering from related input pins. In other words, the chip 112 receives input key signals from the keys 102, 104, 106, and 108 through 4 input pins 120, 122, 124, and 126. When there are too many input pins, both the chip area and manufacturing cost increases significantly. There is a need to disclose a chip having less I/O pins so as to reduce manufacturing cost and chip size simultaneously.

SUMMARY OF THE INVENTION

In the embodiment, a key signals input apparatus for delivering key signals into a chip by means of an analog signal so as to reduce the number of chip I/O (input/output) includes a plurality of keys and a signal conversion module. Each key has an output connected to a voltage input wire, wherein a combination of key input values indicated by key statuses of the plurality of keys indicates the chip to perform a logic operation. The signal conversion module has a plurality of inputs and an analog output, wherein each of the inputs coupled with one of the voltage input wires. The signal conversion module determines an analog voltage value in response to a combination of the voltage values of the voltage input wires, the analog voltage value being sent to the chip through the analog output so as to indicate the chip to perform the logic operation according to an indication of the key input values.

In the embodiment, the signal conversion module includes a plurality of resistors to generate the analog voltage value by voltage division, and different combinations of the voltage values determine different analog voltage values.

In the embodiment, the chip includes an analog signal decoding module for receiving and decoding the analog voltage value to recover the input key values in the chip, and a main module for performing the logic operation according to the recovered input key values.

In the embodiment, the analog signal decoding module includes comparators identical in number to the voltage input wires, each comparator receives the analog voltage value and compares the analog voltage value with a reference voltage value of the comparator to generate a logic status, and the recovered input key values are a combination of the logic statuses delivered from said comparators.

In the embodiment, the analog signal decoding module includes an analog-to-digital converter for converting the analog voltage value to obtain the recovered input key values.

In the embodiment, a method for delivering key signals into a chip by means of an analog signal so as to reduce the number of chip I/O (input/output) includes the following steps. First, converting a plurality of digital key signals into an analog voltage value; directing the analog voltage value into a chip; decoding the analog voltage value to recover the digital key signals in the chip; and performing a logic operation in the chip as an indication of the digital key signals.

In the embodiment, a control chip in an optical disk drive includes an analog signal decoding module for receiving and decoding an analog signal to recover a plurality of digital signals in the chip, and a main module for performing logic operations according to the recovered digital signals.

In the embodiment, wherein the plurality of digital signals indicates the input signals of keys which are formed on a control panel of the optical disk drive.

It is to be understood that both the foregoing general description and the following detailed description are examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
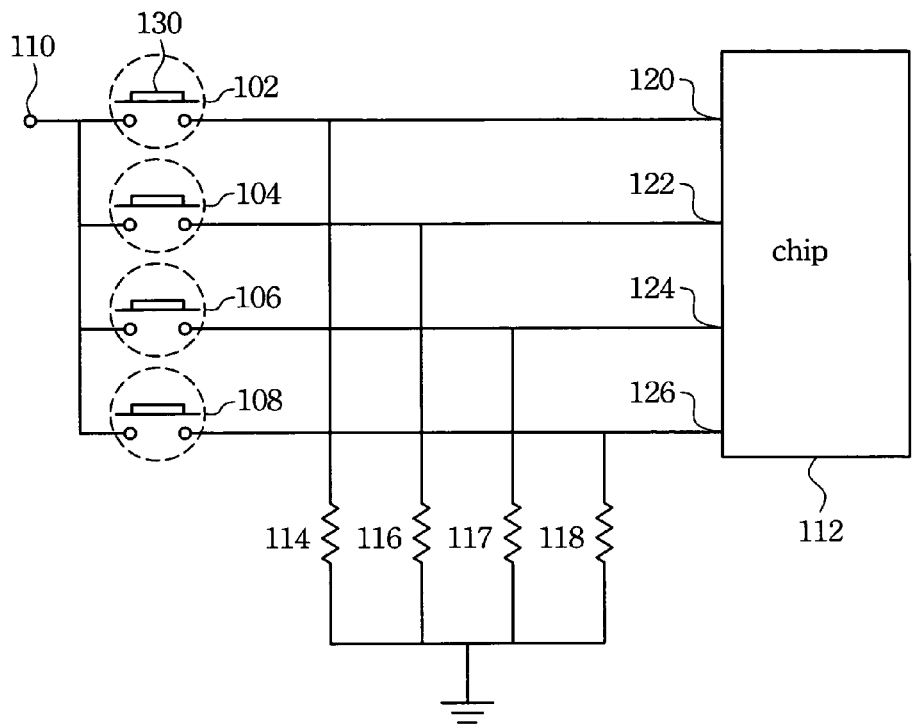
FIG. 1 is a circuit diagram illustrating a traditional approach for inputting key signals into a chip.

Reference will now be made in detail to the present preferred embodiments of the invention, examples of which are illustrated in the accompanying drawings. Wherever possible, the same reference numbers are used in the drawings and the description to refer to the same or like parts.

The present invention discloses an apparatus and related operating method to overcome the disadvantage of the conventional approach above-mentioned that too many chip I/O occupies a lot of chip area and increases manufacturing cost simultaneously. Analog signals having different voltage levels are employed for delivering key statuses to IC chip for further processing such that chip I/O between the IC chip and related function keys are less than before. Chip designers may obtain more design flexibility since there are more spaces releasing from chip I/O.

Figure 2:
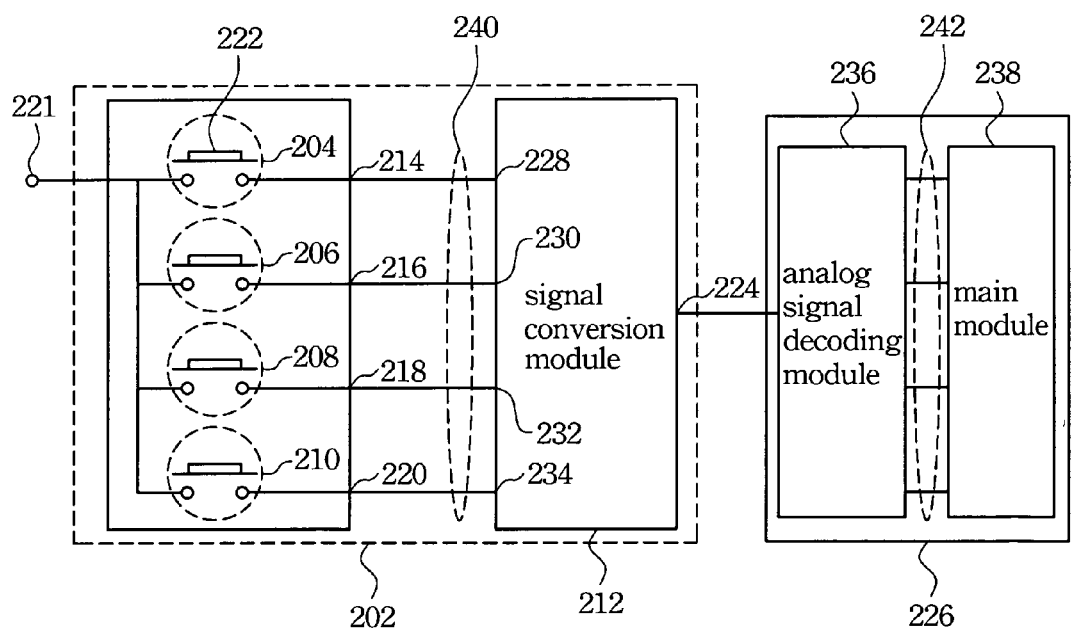
FIG. 2 is a block diagram illustrating a preferred embodiment according to the invention.

FIG. 2 is a block diagram illustrating a preferred embodiment according to the invention. With reference to FIG. 2, the key signals input apparatus 202 includes keys 204, 206, 208, 210, and a signal conversion module 212. For example, in FIG. 2, the key signal input apparatus 202 has four keys, each key may indicate a conducting or breaking status through an output. In FIG. 2, keys 204, 206, 208, and 210 have outputs 214, 216, 218, and 220 respectively. When a switch 222 of the key 204 is pressed to make the key 204 being at the conducting status, the reference voltage 221 is transferred to the output 214 through the key 204 to force the output 214 to output a first voltage value (the reference voltage 221). When the switch 222 is released and make the key 204 being at the breaking status, the voltage value of the output 214 is discharged to a second voltage value by the signal conversion module 212. According to a similar operation mode, the keys 206, 208, and 210 respectively have a conducting and breaking statuses, and also respectively provide a first voltage value and a second voltage value.

Four outputs 214, 216, 218, and 220 are respectively connected to the four inputs 228, 230, 232, and 234 of the signal conversion module 212 through voltage input wires 240. Combinations of the voltage values at the voltage input wires 240 are used to represent the key signals. Thereafter, the signal conversion module 212 determines an analog voltage value according to the combinations of the voltage values at the outputs 214, 216, 218, and 220. The analog voltage value is then sent to a chip 226 through an analog output 224. Thus, the output of the key signals input apparatus only contains a single analog output (the analog output 224) as chip I/O.

The signal conversion module 212 detects whether a certain key is being pressed according to a weighting of each key. Assume the output analog voltage value $V_0$ is expressed in the following equation:

$$V_0 = (W1*SW1 + W2*SW2 + W3*SW3 + W4*SW4)*Vref$$

where SW1, SW2, SW3, and SW4 represent the voltage values of the outputs 214, 216, 218, and 220, respectively. W1, W2, W3, W4 are different weightings and Vref is a reference voltage.

For example, the weighting relationship can be designed as follows:

$$W4 = 2*W3 = 4*W2 = 8*W1$$

According to different weightings, an analog voltage value is derived when a key is pressed. There are sixteen combinations available if four keys are used, which indicates that there are sixteen different levels provided for the analog voltage values if appropriate weightings are designed. At this time, only an analog voltage value is used for the chip 226 to determine the pressing statuses of the keys. The chip 226 no longer requires four inputs to determine the pressing statuses of the keys as the conventional does.

Figure 3:
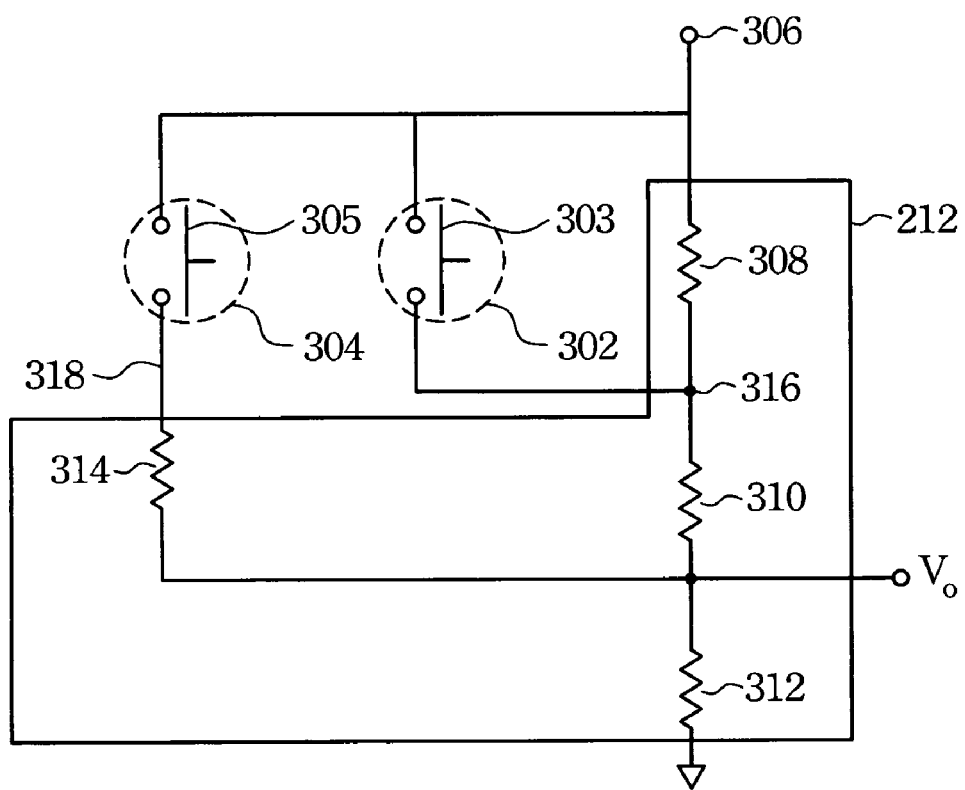
FIG. 3 is a diagram illustrating an exemplary circuit of signal conversion module 212 in combination with 2 keys.

Basically, the signal conversion module 212 of the embodiment may encompass resistors connecting in-series so as to derive this analog voltage value by means of voltage divisions. Different combinations of the voltage values of the outputs at the outputs 214, 216, 218, and 220 may determine different analog voltage values. FIG. 3 is a diagram illustrating an exemplary circuit of the signal conversion module 212 in combination with two keys. With reference to FIG. 3, the circuit has two keys, 302 and 304.

When a switch 303 of the key 302 is pressed and a switch 305 of the key 304 is released, which indicates that the key 302 is in a conducting status and the key 304 is in a breaking status. A node 316 is electrically connected to a reference voltage 306. Therefore the voltage on the node 316 is the same as the reference voltage 306. The voltage value of an output Vo is the voltage division of the voltage on the node 316 through the resistor 310 and 312.

When the switch 303 of the key 302 is released and the switch 305 of the key 304 is pressed, the key 302 is in a breaking status and the key 304 is in a conducting one. A node 318 is electrically connected to the reference voltage 306 now such that the voltage on the node 318 is the same as the reference voltage 306. The voltage value of the output Vo is the voltage division of the voltage on the node 318 through the resistor 314 and the resistor 312.

When both the switches 303 and 305 are released, the voltage value of the output Vo is the voltage division of the reference voltage 306 through the resistors 308, 310 and 312. Additionally, when both the switches 303 and 305 are pressed, the voltage value of the output Vo is the superposition of the voltage division results from the reference voltage 306 through the resistors 314, 310, and 312. Thus, the voltage value of the output Vo is an analog voltage value. When there are different combinations of conducting and breaking statuses at the keys 302 and 304, the analog voltage value is different. Therefore, the output of the keys 302 and 304 can be replaced by the output Vo and the output Vo is sent as an I/O value to the chip 226. Total input pins of the chip 226 are therefore reduced from two to one. The circuit in FIG. 3 is just an example of the embodiment. Any ordinary person having skills in the art may design his circuit that reduces a plurality of inputs to one with reference to the embodiment, and any similar variation or modification within the spirits of the embodiment should be included in the scopes of the appended claims.

With reference to FIG. 2, the chip 226 has an analog signal decoding module 236 and a main module 238. The analog signal decoding module 236 is connected to the analog output 224 to receive the analog voltage value and then decodes this analog voltage value to recover original four input key values. The main module 238 receives the four input key values through the inputs 242 and performs a main logic operation according to the indication of these four input key values.

Figure 4:
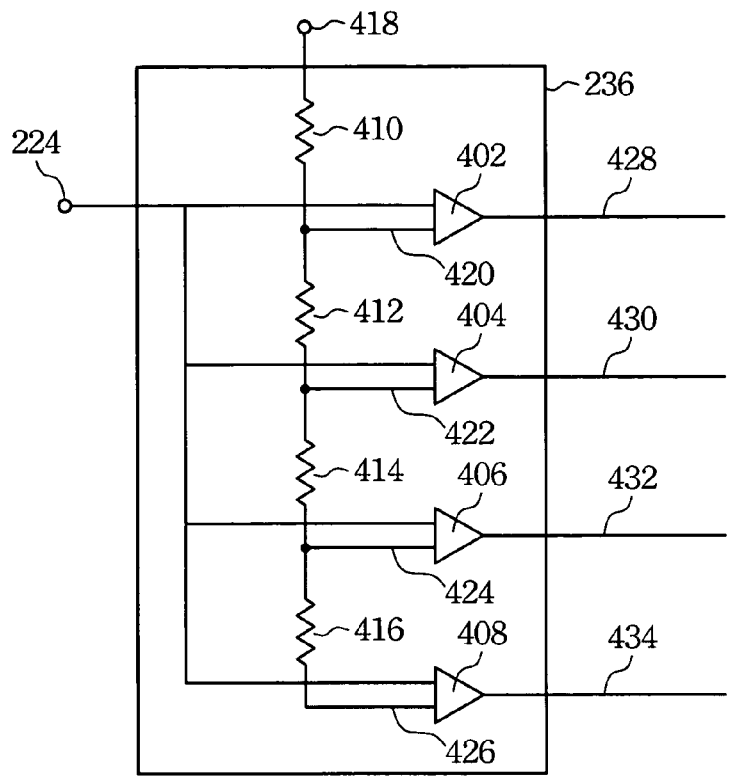
FIG. 4 is a diagram illustrating an exemplary circuit of the analog signal decoding module 236.

FIG. 4 is a diagram illustrating an exemplary circuit of the analog signal decoding module 236. In FIG. 4, the exemplary circuit uses four comparators 402, 404, 406, and 408 to recover the four input key values from the analog voltage value. The analog output 224 is connected to the comparators 402, 404, 406, and 408 and different voltage values are derived on nodes 420, 422, 424, and 426 from a reference voltage 418 by voltage division through resistors 410, 412, 414, and 416. The nodes 420, 422, 424, and 426 are connected to input ends of the comparators 402, 404, 406, and 408 respectively, and the analog output 224 is fed into the other input end of the comparators 402, 404, 406 and 408. The comparators 402, 404, 406, and 408 are used to decode the analog voltage value, i.e., the combinations of the voltage values of the keys 204, 206, 208, and 210 are recovered at the outputs 428, 430, 432, and 434 of the comparators (as shown in FIG. 2).

For example, the comparator 402 receives the analog voltage value of the analog output 224, compares the analog voltage value with the voltage value on the node 420, and finally generates a logic status (such as logic 1 or 0) on the output 428. The outputs 430, 432, and 434 also generate their logic statuses, respectively, in the same way. With reference to FIGS. 2 and 4, combinations of the logic statuses of the outputs 428, 430, 432, and 434 are recovered as original combinations of voltage values of the outputs 214, 216, 218, 220 of the keys. Therefore, according to the embodiment, the disclosed circuit is able to restore all the combinations of the keys 204, 206, 208, and 210.

Figure 5:
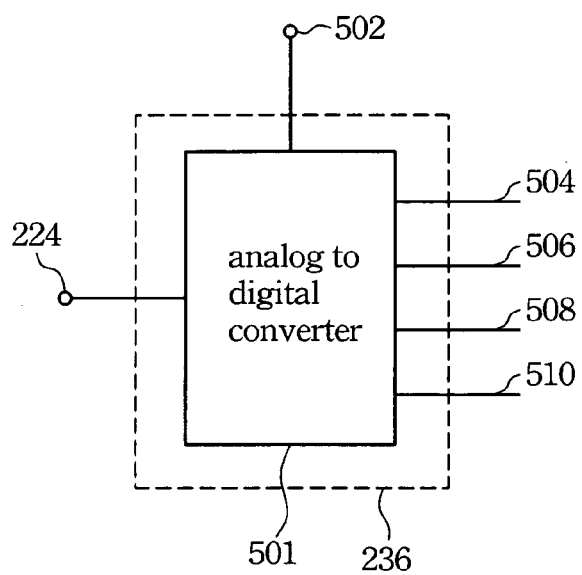
FIG. 5 is a diagram illustrating another exemplary circuit of the analog signal decoding module 236.

FIG. 5 is a diagram illustrating another exemplary circuit of the analog signal decoding module 236. With reference to FIGS. 5 and 2, an analog-to-digital converter 501 is used as the analog signal decoding module 236. A reference voltage 502 is a reference voltage for the analog-to-digital converter 501 that is originally designed in the chip 226 for common applications. Accordingly, the chip 226 can use the analog-to-digital converter 501 designed therein when performing the main logic operation. The analog voltage value is directed to the analog-to-digital converter 501 through an analog output 224. The analog-to-digital converter 501 detects the analog voltage value at a time interval, and then converts the analog voltage value into four input key values, before delivering them through four outputs 504, 506, 508, and 510 to the main module 238. Combinations of logic statuses of the outputs 504, 506, 508, and 510 are used to indicate the original combinations of voltage values of the outputs 214, 216, 218, and 220. Thus, only little portions of the bandwidth of the analog-to-digital converter 501 are used by the signal conversion module 212. The chip 226 mentioned above is, for example, a servo control circuit in an optical disk player or the like. The keys 204, 206, 208, and 210 are, for example, buttons on the front panel of an optical disk player.

The circuit mentioned above is able to reduce the number of the inputs of the chip 226 from plural to one. With reference to this circuit, one skilled in the art can reduce the input pin number of the inputs of the chip 226 from a first number to a second number, where the second number is smaller than the first one. For example, one can reduce the number of the inputs from four (the first number) to two (the second number), or from sixteen to four. All variations regarding the input pin numbers should be included in claim scopes of the invention.

The circuit mentioned above can be described as a method for inputting key signals by means of an analog voltage including the steps as follows. First, a chip containing a main module and an analog signal decoding module is provided, wherein the main module has a predetermined number (such as four) of inputs. Please note that the predetermined number of inputs corresponds to the same number of voltage input wires. Next, each voltage input wire provides a first voltage value and a second voltage value substantially, which may, for example, represent logic 1 and logic 0, respectively.

Next, a signal conversion module for receiving the number of voltage input wires is provided. Then, the signal conversion module determines an analog voltage value according to the combinations of the voltage values of the predetermined number of voltage input wires.

Next, the analog signal decoding module receives the analog voltage value through an analog output. Then, the analog signal decoding module decodes the analog voltage value to derive the predetermined number of input key values. Subsequently, the main module receives the predetermined number of input key values through the predetermined number of inputs. The signal conversion module therefore reduces the predetermined number of voltage input wires to one analog output. For example, the circuit mentioned above reduces the number of the voltage input wires from four to one. The fabrications of the signal conversion module and the analog signal decoding module are the same as for the previous embodiment. Please note that the main module 236 performs the same main logic operation as the chip 112 does.

The present invention also discloses a method for delivering key signals into a chip by means of an analog signal so as to reduce the number of chip I/O (input/output). The method includes the following steps. First, converting a plurality of digital key signals into an analog voltage value; directing the analog voltage value into a chip; decoding the analog voltage value to recover the digital key signals in the chip; and performing a logic operation in the chip as an indication of the digital key signals.

Although the present invention has been described in considerable detail with reference to certain preferred embodiments thereof, other embodiments are possible. Therefore, their spirit and scope of the appended claims should not be limited to the description of the preferred embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A method for delivering key signals into a chip by means of an analog signal so as to reduce the number of chip I/O (input/output), the method comprising:
  converting a plurality of digital key signals from a plurality of keys indicated by statuses of said keys into an analog voltage value;
  directing the analog voltage value into a signal conversion module of the chip by a plurality of voltage input wires connected to the keys individually;
  decoding the analog voltage value by the signal conversion module to recover the digital key signals in the chip; and
  performing a logic operation in the chip as an indication of the digital key signals.

2. The method of claim 1, wherein the chip is a control chip of an optical disk player.

3. The method of claim 1, wherein the digital key signals are derived according to statuses of keys delivered from a control panel of the optical disk player.

4. A key signals input apparatus for delivering key signals into a chip by means of an analog signal so as to reduce the number of chip I/O (input/output, comprising:
  a plurality of keys, each key having an output connected to a voltage input wire, wherein a combination of key input values indicated by key statuses of the plurality of keys indicates the chip to perform a logic operation; and
  a signal conversion module, having a plurality of inputs and an analog output, wherein each of the inputs coupled with one of the voltage input wires, the signal conversion module determining an analog voltage value in response to a combination of the voltage values of the voltage input wires, the analog voltage value being sent to the chip through the analog output so as to indicate the chip to perform the logic operation according to an indication of the key input values.

5. The apparatus of claim 4, wherein the signal conversion module comprises a plurality of resistors to generate the analog voltage value by voltage division, and different combinations of the voltage values determine different analog voltage values.

6. The apparatus of claim 4, wherein the chip comprises:
  an analog signal decoding module, receiving and decoding the analog voltage value to recover the input key values in the chip; and
  a main module, performing the logic operation according to the recovered input key values.

7. The apparatus of claim 6, wherein the analog signal decoding module comprises comparators identical in number to the voltage input wires, each comparator receives the analog voltage value and compares the analog voltage value with a reference voltage value of the comparator to generate a logic status, and the recovered input key values are a combination of the logic statuses delivered from said comparators.

8. The apparatus of claim 6, wherein the analog signal decoding module comprises an analog-to-digital converter for converting the analog voltage value to obtain the recovered input key values.

9. The apparatus of claim 4, wherein the chip is a control chip of an optical disk player.

10. The apparatus of claim 9, wherein the plurality of keys are formed on a control panel of the optical disk player.

11. A control chip in an optical disk drive, comprising:
  an analog signal decoding module, receiving and decoding an analog signal to recover a plurality of digital signals in the chip, wherein the analog signal decoding module comprises comparators for receiving the analog signal and comparing the analog signal with a reference voltage value of the comparator to generate a logic status, and the recovered the plurality of digital signals are a combination of the logic statuses delivered from said comparators; and
  a main module, performing logic operations according to the recovered digital signals.

12. The control chip of claim 11, wherein the analog signal decoding module comprises an analog-to-digital converter for converting the analog signal to obtain the recovered the plurality of digital signals.

13. A control chip in an optical disk drive, comprising:
  an analog signal decoding module, receiving and decoding an analog signal to recover a plurality of digital signals in the chip, wherein the plurality of digital signals indicates the input values of keys, an input value of each key indicated by status of said each key which are formed on a control panel of the optical disk drive; and
  a main module, performing logic operations according to the recovered digital signals.

* * * * *